United States Patent
Kim et al.

(10) Patent No.: US 9,497,017 B1
(45) Date of Patent: Nov. 15, 2016

(54) SIGNAL PROCESSING APPARATUS AND METHOD OF CONTROLLING CLOCK ACCORDING TO ANALOG TO DIGITAL CONVERSION THEREOF

(71) Applicant: KOREA RESEARCH INSTITUTE OF STANDARDS AND SCIENCE, Daejeon (KR)

(72) Inventors: Jin-Mok Kim, Daejeon (KR); Hyukchan Kwon, Daejeon (KR); YongHo Lee, Daejeon (KR); Ki Woong Kim, Daejeon (KR); Kwonkyu Yu, Daejeon (KR)

(73) Assignee: Korea Research Institute of Standards and Science, Daejeon (KR)

(*) Notice: Subject to any disclaimer, the term of this patent is extended or adjusted under 35 U.S.C. 154(b) by 0 days.

(21) Appl. No.: 14/946,306

(22) Filed: Nov. 19, 2015

(30) Foreign Application Priority Data

Oct. 23, 2015 (KR) .......................... 10-2015-0147980

(51) Int. Cl.
  *G06F 1/10* (2006.01)
  *H04L 7/00* (2006.01)
  *H03M 1/12* (2006.01)
(52) U.S. Cl.
  CPC .............. *H04L 7/0008* (2013.01); *H03M 1/12* (2013.01)

(58) Field of Classification Search
  USPC .................. 375/356, 260; 600/347; 324/142; 398/110
  See application file for complete search history.

(56) References Cited

U.S. PATENT DOCUMENTS

| 8,565,606 | B2* | 10/2013 | Kim | G01R 33/0354 398/110 |
| 9,357,555 | B2 | 5/2016 | Kim et al. | |
| 2008/0012550 | A1* | 1/2008 | Shuey | G01R 21/133 324/142 |
| 2011/0224521 | A1* | 9/2011 | Gericke | A61B 5/053 600/347 |

FOREIGN PATENT DOCUMENTS

| KR | 2013-0100557 A | 9/2013 |
| KR | 10-1440458 B1 | 9/2014 |

* cited by examiner

*Primary Examiner* — Eva Puente
(74) *Attorney, Agent, or Firm* — Harness, Dickey & Pierce, P.L.C.

(57) ABSTRACT

Provided is signal processing device including superconducting quantum interference device (SQUID) sensors configured to sense a signal for each of a plurality of channels, analog to digital converters (ADC) configured to convert analog signals input to a predetermined number of channels from the SQUID sensors into digital signals by using a clock signal, local oscillators corresponding to the ADCs, respectively and configured to generate the clock signal having a reference clock frequency for an operation of a corresponding ADC, and a controller configured to the local oscillators to enable the reference clock frequency to have a frequency beyond a frequency range available to the SQUID sensor.

11 Claims, 12 Drawing Sheets

FIG. 6 next to P-182 ↓

| | | | | | | | | |
|---|---|---|---|---|---|---|---|---|
| P-001 → | M01-01 | 001 | P-027 → | M01-03 | 003 | P-183 → | M01-15 | 015 |
| P-002 → | M02-07 | 023 | P-028 → | M02-09 | 025 | P-184 → | M02-05 | 021 |
| P-003 → | M03-10 | 042 | P-029 → | M03-12 | 044 | P-185 → | M03-08 | 040 |
| P-004 → | M04-02 | 050 | P-030 → | M04-04 | 052 | P-186 → | M04-16 | 064 |
| P-005 → | M05-16 | 080 | P-031 → | M05-02 | 082 | P-187 → | M05-14 | 078 |
| P-006 → | M06-02 | 082 | P-032 → | M06-04 | 084 | P-188 → | M06-16 | 096 |
| P-007 → | M07-06 | 104 | P-033 → | M07-10 | 106 | P-189 → | M07-06 | 102 |
| P-008 → | M08-14 | 126 | P-034 → | M08-16 | 128 | P-190 → | M08-12 | 124 |
| P-009 → | M09-06 | 134 | P-035 → | M09-08 | 136 | P-191 → | M09-04 | 132 |
| P-010 → | M10-03 | 147 | P-036 → | M10-05 | 149 | P-192 → | M10-01 | 145 |
| P-011 → | M11-15 | 175 | P-037 → | M11-01 | 161 | P-193 → | M11-13 | 173 |
| P-012 → | M12-04 | 180 | P-038 → | M12-06 | 182 | P-194 → | M12-02 | 178 |
| P-013 → | M13-02 | 194 | P-039 → | M13-04 | 196 | P-195 → | M13-16 | 208 |
| P-014 → | M01-02 | 002 | P-040 → | M01-04 | 004 | P-196 → | M01-16 | 016 |
| P-015 → | M02-08 | 024 | P-041 → | M02-10 | 026 | P-197 → | M02-06 | 022 |
| P-016 → | M03-11 | 043 | P-042 → | M03-13 | 045 | P-198 → | M03-09 | 041 |
| P-017 → | M04-03 | 051 | P-043 → | M04-05 | 053 | P-199 → | M04-01 | 049 |
| P-018 → | M05-01 | 049 | P-044 → | M05-03 | 051 | P-200 → | M05-15 | 063 |
| P-019 → | M06-03 | 083 | P-045 → | M06-05 | 085 | P-201 → | M06-01 | 081 |
| P-020 → | M07-09 | 105 | P-046 → | M07-11 | 107 | P-202 → | M07-07 | 103 |
| P-021 → | M08-15 | 127 | P-047 → | M08-01 | 113 | P-203 → | M08-13 | 125 |
| P-022 → | M09-07 | 135 | P-048 → | M09-09 | 137 | P-204 → | M09-05 | 133 |
| P-023 → | M10-04 | 148 | P-049 → | M10-08 | 150 | P-205 → | M10-02 | 146 |
| P-024 → | M11-18 | 176 | P-050 → | M11-02 | 162 | P-206 → | M11-14 | 174 |
| P-025 → | M12-05 | 181 | P-051 → | M12-07 | 183 | P-207 → | M12-03 | 179 |
| P-026 → | M13-03 | 195 | P-052 → | M13-05 | 197 | P-208 → | M13-01 | 193 |

↓ to P-027   ↓ to P-053   ↓ to new P-001

SIGNAL PROCESSING APPARATUS AND METHOD OF CONTROLLING CLOCK ACCORDING TO ANALOG TO DIGITAL CONVERSION THEREOF

CROSS-REFERENCE TO RELATED APPLICATIONS

This U.S. non-provisional patent application claims priority under 35 U.S.C. §119 of Korean Patent Application No. 10-2015-0147980, filed on Oct. 23, 2015, the entire contents of which are hereby incorporated by reference.

BACKGROUND

The present disclosure herein relates to a signal processing system, and more particularly to, a signal processing apparatus that decreases the effect of noise in a sensor generated according to the analog to digital conversion of a signal received from a plurality of sensors, and a method of controlling clock according to analog to digital conversion thereof.

A signal processing apparatus converts an analog signal received from a plurality of sensors to a digital signal for signal processing. In this case, the plurality of sensors may be sensors that sense biometric signals at medical devices, for example. These sensors include sensors for measuring magnetocardiography (MCG), magnetoencephalography (MEG), electrocardiography (ECG), electroencephalography (EEG), etc. sensors, for example. For example, one of these sensors is a superconducting quantum interference device (SQUID) sensor.

The signal processing apparatus uses an analog to digital converter (ADC) for the digital conversion of an analog signal from the SQUID sensor. A plurality of ADCs may be used due to a plurality of channels, a common digital clock frequency is used for the operation of all ADCs, and the output of the ADCs is transmitted in series or in parallel.

When the plurality of SQUID sensors operate in a magneticallay shielded room and an ambient high-frequency electromagnetic signal is generated, the SQUID sensor receives the effect of the signal and thus the function of the SQUID sensor decreases. In particular, the high-frequency digital clock signal used when converting an analog voltage signal into a digital signal may significantly decrease the performance of the SQUID sensor, as described above. Thus, in a structure that uses a plurality of ADCs or in a structure that uses the common digital clock frequency, the SQUID sensor experiences an increase in noise of a digital signal or beating due to a clock signal overlap or a phase difference. An increase in high-frequency clock noise in the SQUID system that measures a weak magnetic field decrease system due to inflow into the SQUID performance and since the beating generates low-frequency noise, there is a limitation in that it is difficult to precisely measure a magnetic field in a low-frequency region.

SUMMARY

The present disclosure provides a signal processing apparatus that may decrease the effect of noise generated in a sensor according to a digital clock signal or operating clock frequency due to analog to digital conversion when the signals of a plurality of sensors are processed, and a method of controlling clock according to analog to digital conversion of the signal processing apparatus.

The present disclosure also provides a signal processing apparatus that may prevent an error in magnetic field measurement due to the beating generated according to the operations of a plurality of sensors, and a method of controlling clock according to analog to digital conversion of the signal processing apparatus.

An embodiment of the inventive concept provides signal processing apparatuses including superconducting quantum interference device (SQUID) sensors configured to sense a signal for each of a plurality of channels; analog to digital converters (ADC) configured to convert analog signals input to a predetermined number of channels from the SQUID sensors into digital signals by using a clock signal; local oscillators corresponding to the ADCs, respectively and configured to generate the clock signal having a reference clock frequency for an operation of a corresponding ADC; and a controller configured to the local oscillators to enable the reference clock frequency to have a frequency beyond a frequency range available to the SQUID sensor.

In an embodiment, the controller may be configured to set the reference clock frequency to enable a minimum beating frequency to have a frequency beyond the frequency range available to the SQUID sensor based on a preset reference clock frequency.

In an embodiment, the frequency range available to the SQUID sensor may have a frequency range of about 0 to about 200 Hz.

In an embodiment, the controller may be configured to set the reference clock frequency of a clock signal input to each of the ADCs at a preset frequency interval based on the reference clock frequency.

In an embodiment, the controller may be configured to select the reference clock frequency to have a length of data corresponding to a value that is obtained by adding or subtracting a value smaller than a unit bit of predetermined reference unit serial data.

In an embodiment, a number of the ADCs may be determined to be smaller than or equal to a natural number that is obtained by dividing a reference clock frequency range operating the ADC by the frequency interval.

In an embodiment, the signal processing apparatus may further include a data synchronization module configured to receive, through an optical line, data obtained through digital conversion from each of the ADCs, and synchronize the received data based on a reference synchronization signal; a signal transmission module configured to signal-process the synchronized data; and a data input/output card connected to between the data synchronization module and the signal transmission module and configured to transmit the data synchronization through the data synchronization module to a computer.

In an embodiment, the data input/output card may be configured to extract data on a channel and a voltage, remove data having no information, and output data obtained through removal to the computer.

In an embodiment, the signal transmission module may be configured to generate temporary data package based on data on the channel and the voltage, and re-arrange data in sequence of the channel number by using channel information in the temporary data package to generate a data package.

In an embodiment, the signal transmission module may be configured to delete one of overlapped channel data and generate the data package through loading lost channel data from a previous package data, when there is overlapped channel data in the temporary data package.

In an embodiment, the signal transmission module may be configured to alternately select the data packages generated to have a reference sample rate and generate data package having a sample rate that is obtained by reducing a data package sample rate to ½ of the reference sample rate.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIG. 6 illustrates a data package of received data according to the inventive concept;

DETAILED DESCRIPTION

Exemplary embodiments of the present invention are described below in detail with reference to the accompanying drawings. It should be noted that only descriptions required for understanding operations according to the present invention are provided below and other descriptions are not provided in order not to obscure the subject matter of the present invention.

The inventive concept provides a signal processing apparatus that may convert analog signals detected from a plurality of sensors into digital signals and set the reference clock frequencies of analog to digital converters (ADC) differently from one another, and a method of controlling clock according to the analog to digital conversion of the signal processing apparatus. The signal processing apparatus proposed in the inventive concept may be applied to various fields in which a serial digital signal is received and processed. For example, it may be utilized for control signal reception for the control of a plurality of superconducting quantum interference devices (SQUID) that sense biometric signals.

Figure 1:
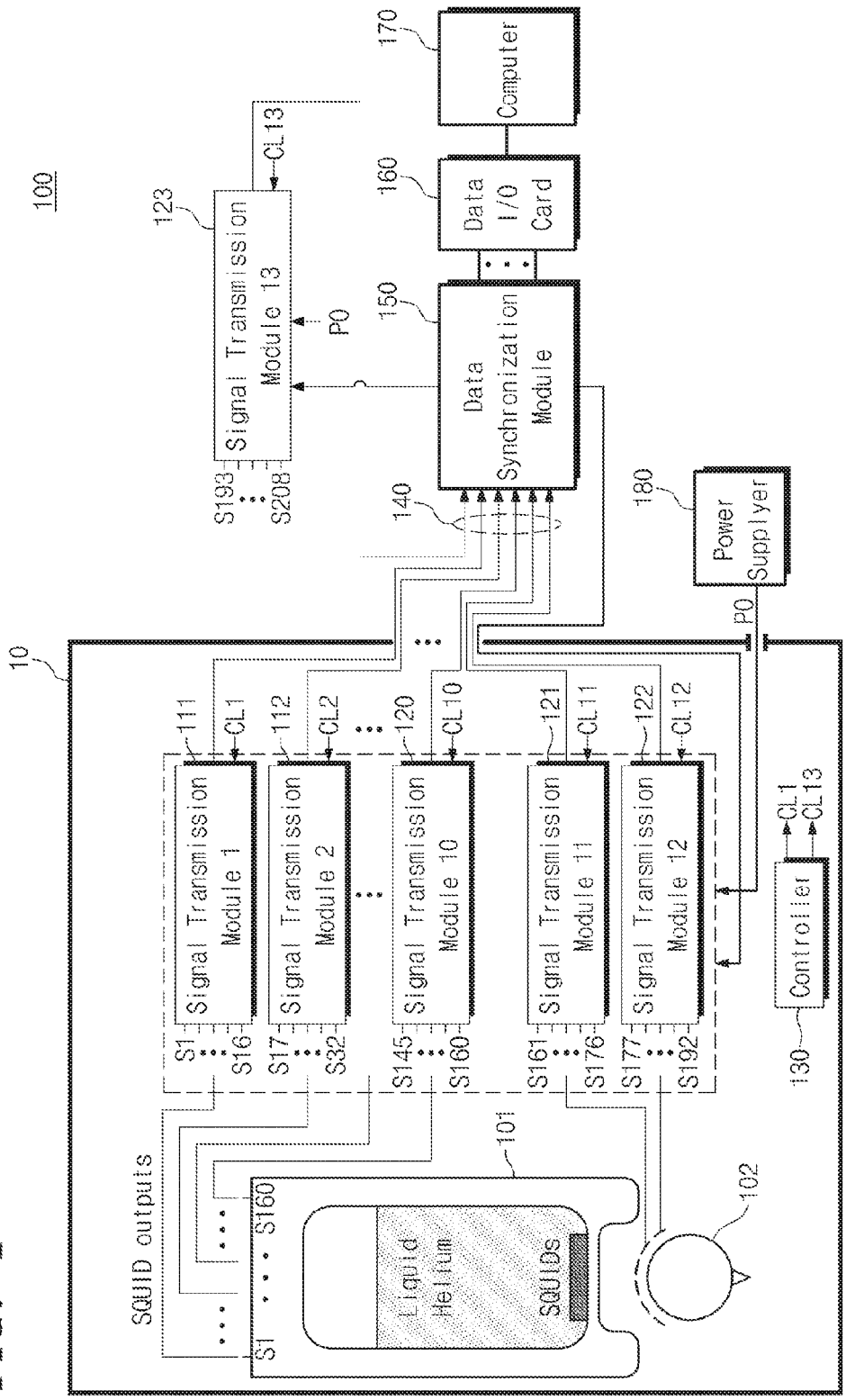
FIG. 1 illustrates a signal processing apparatus according to the inventive concept.

FIG. 1 illustrates a signal processing apparatus according to the inventive concept.

Referring to FIG. 1, a signal processing apparatus 100 includes sensors 101 and 102, signal transmission modules 111 to 123, a controller 130, an optical cable 140, a data synchronization module 150, a data input/output card 160, and a computer 170.

The sensors 101 and 102 may measure magnetocardiography (MCG), magnetoencephalography (MEG), electrocardiography (ECG), electroencephalography (EEG), etc. As an example, the sensor 102 may measure EEG. The sensors may include a SQUID sensor as an example.

Each of the signal transmission modules 111 to 123 may be connected to the sensors, e.g., SQUID. For example, it is assumed that each of the signal transmission modules 111 to 123 receives 16 sensor signals from 16 sensors.

The signal transmission modules 111 to 123 performs analog to digital conversion on the signal received through the sensors, convert the digital signal into an optical signal and transmit the optical signal to the data synchronization module 150 through the optical cable 140. As described above, since there are 16 sensors, each of the signal transmission modules 111 to 123 may collect channel data on the 16 channels.

The sensors 101 and 102 and some 111 to 122 of the signal transmission modules may be disposed inside a shielded room 10. In this case, one 123 of the signal transmission modules may also be disposed outside the shielded room 10. The numbers and positions of the signal transmission module that are disposed inside or outside the shielded room 10 are exemplary and are not limited thereto.

The shielded room 10 provides a space in which the signal transmission modules 111 to 122 may stably measure MCG, MEG, ECG, EEG, etc. from a subject to be measured, through the SQUID sensor. The shielded room 10 may be a magnetically shielded room (MSR) or a radio-frequency shielded room (RFSR).

The controller 130 may generate a clock signal used to convert an analog signal from the sensor and provide the generated clock signal to the signal transmission modules 111 to 123. The function of the controller 130 may be included in the data synchronization module 150 or the computer 170 or the controller may operate in line therewith.

The optical cable 140 connects signal the transmission modules to the data synchronization module 150. The optical cable 140 includes a plurality of optical lines OL1 to OL13.

The data synchronization module 150 receives individual serial data signals corresponding to the signal transmission modules 111 to 123. The data synchronization module 150 converts the individual serial digital signals into digital data signals. The data synchronization module outputs the digital data signals to the data input/output card 160.

The data input/output card 160 outputs synchronized digital signals to the computer 170. To this end, the data input/output card 160 is connected to the computer 170 and controls the data input/output of the computer 170 through the data input/output control of a signal. The data input/output card 160 may also be included in the computer 170.

The computer 170 may be considered as a signal processing module and performs signal processing according to the number of the SQUID sensor by using synchronous digital data signals. Also, the computer 170 stores data for signal processing or processed data.

The SQUID sensors 101 and 102 are precise magnetic sensors and have a property significantly sensitive to an external electromagnetic signal. Accordingly, even when a noise shielding device is disposed around a analog to digital converter (ADC) inside the signal processing modules 111 to 123 that perform analog to digital conversion, it easily responses to a digital signal generated in a digital clock signal from an ADC. The number of ADCs is minimized so that the digital signal of the ADC does not affect the SQUID sensors 101 and 102 of multiple channels, and for example, one signal transmission module (or optical transmission module) including one ADC for every 16 SQUID sensors converts SQUID sensors outputs into digital signals.

In this case, when reference clock frequencies for operation are the same among ADCs, clock signals overlap and thus the effect of a digital signal increases, or a low-frequency beating signal is generated due to a phase difference in digital signal, and these digital signals are represented as noise by the SQUID sensor. In order to decrease the effect of the noise, the reference clock frequencies of DACs, i.e., signal transmission modules are set to be different from one another. Accordingly, digital signals do not overlap one another, and beat frequency noise due to different clock frequencies leaves the measuring region of a SQUID system.

To this end, the signal processing apparatus 100 proposed in the inventive concept enables the controller 130 to set reference clock frequencies used for analog digital conversion in each of the signal transmission modules 111 to 123 to be different from one another. In this case, the controller 130 may use a frequency region outside an available frequency region by utilizing the reference clock frequency to prevent malfunction caused by the inflow of a clock signal into sensors due to analog to digital conversion. Also, since a difference between reference clock frequencies for analog to digital conversion is set as a band beyond a frequency region available to the SQUID sensor, beating occurring when the SQUID sensor operates may leave a magnetic field measuring band.

Figure 2:
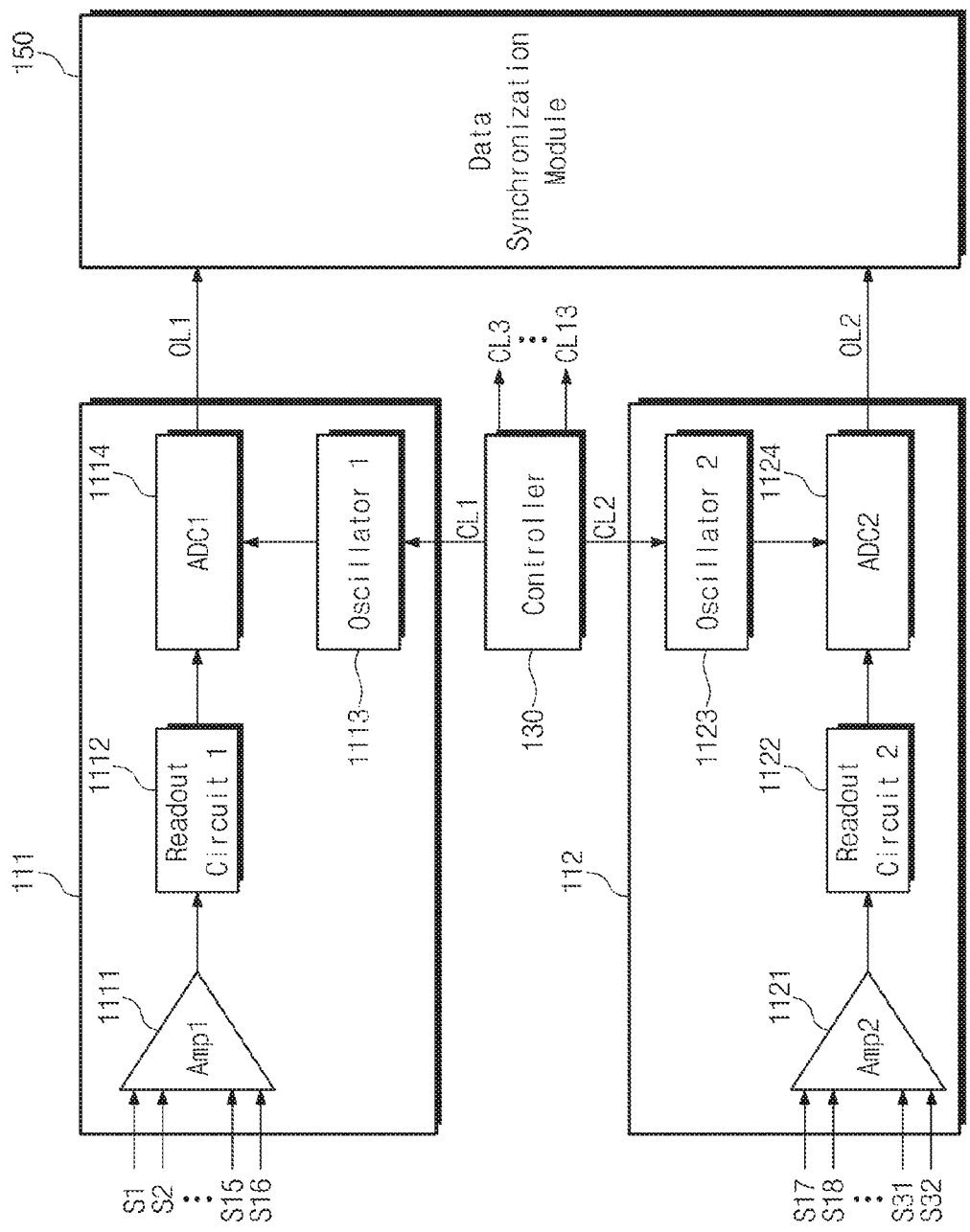
FIG. 2 illustrates a signal processing apparatus that performs clock control according to analog to digital conversion according to the inventive concept.

FIG. 2 illustrates a signal processing apparatus that performs clock control according to analog to digital conversion according to the inventive concept.

Referring to FIG. 2, two signal transmission modules 111 and 112 of the signal processing apparatus 100 are shown.

The first signal transmission module 111 includes a first amplifier 1111, a first readout circuit 1112, a first oscillator 1113, and a first ACD 1114.

The first amplifier 1111 amplifies a signal sensed from a sensor and outputs the amplified signal to the first readout circuit 1112.

The first readout circuit 1112 detects an analog signal amplified through the first amplifier 1111 and outputs the detected analog signal to the first ADC 1114.

In this case, the first amplifier 1111 and the first readout circuit 1112 that are disposed at the front end of the first ADC 1114 may be considered as a flux locked-in loop (FLL). The FLL circuit is a converter that measures a biometric, magnetic signal sensed from the SQUID sensor that is a high-sensitive magnetic sensor and converts a measured flux into a voltage. The FLL circuit is a feedback circuit for measuring a change because a voltage appearing according to a change in flux repetitively appears regularly and a section in which the change linearly appears is significantly narrow. Thus, 16 outputs detected from the FLL circuit are output to the first ADC 1114.

The first oscillator 113 generates a clock signal according to a first clock control signal CL1 that is output from the controller 130. The first oscillator 113 outputs the generated clock signal to the first ADC 1114.

The ADC 1114 receives the clock signal and converts an input analog signal into a digital signal by using the received clock signal. The ADC 1114 converts the digital signal into an optical signal so that the digital signal is transmitted through the optical line OL1, and then outputs the optical signal to the data synchronization module 150.

The second transmission module 112 includes a second amplifier 1121, a second readout circuit 1122, a second oscillator 1123, and a second ADC 1124.

In this example, the overall structure and operation of the second signal transmission module 112 are the same as those of the first transmission module 111, so refer to the first signal transmission module 111 for the detailed descriptions.

The ADCs 1114 and 1124 corresponding to the signal transmission modules process 16 analog signals S1 to S16 and 16 analog signals S17 to S32, respectively.

Each of the remaining signal transmission modules 113 to 123 may also process 16 analog signals, like the first and second ADCs 1114 and 1124. Accordingly, 13 optical transmission modules or DACs (e.g., 1114 and 1124) convert about 208 voltage outputs from the SQUID sensors 111 to 120, the EEG sensors 121 and 122, and an extra sensor 123 outside the shielded room into digital signals and transmit the digital signals to the computer 170 through the optical cable 140.

Accordingly, the controller 130 controls the oscillators 1113 and 1123 so that the reference clock frequencies outputs through the oscillators 1113 and 1123 for the operations of the ADCs 1114 and 1124 have a difference of e.g., about 5 kHz. In this case, a frequency band, i.e., a magnetic measuring band available to the SQUID sensor is 0 to 200 Hz.

In the inventive concept, the reference clock frequencies of the signal transmission modules 111 and 112 are determined by clock frequencies based on a transmission rate of data, i.e., a transfer sample rate at which the ADCs 1114 and 1124 output.

Although it is described that the signal transmission modules 111 and 112 include the readout circuits 1112 and 1122, the signal transmission modules 121 and 122 may also include EEG circuits instead of the readout circuits or the signal transmission module 123 may also include an accumulator switch circuit (ACS) instead of the readout circuit.

Although two signal transmission modules 111 and 112 that operate according to the clock control signal of the controller 130 are exemplarily described for the convenience of description, the remaining signal transmission modules 113 to 123 may also operate in response to a third clock control signal CL3 to a thirteenth clock control signal CL13.

Therefore, the controller 130 may control the frequencies of signals output from oscillators to have a frequency interval of about 5 kHz based on one of the signal transmission modules 111 to 123 (a difference (added or subtracted value), such as 5 kHz, 10 kHz, 15 kHz, etc. based on the reference clock frequency of a reference signal transmission module (or ADC)). In this example, 5 kHz is out of a frequency range (e.g., 0 to 200 Hz) available to the SQUID sensors 102 and 103.

The operation of setting the clock frequency used for analog to digital conversion by the signal transmission modules 111 to 112 is described in detail with reference to FIG. 4.

Figure 3:
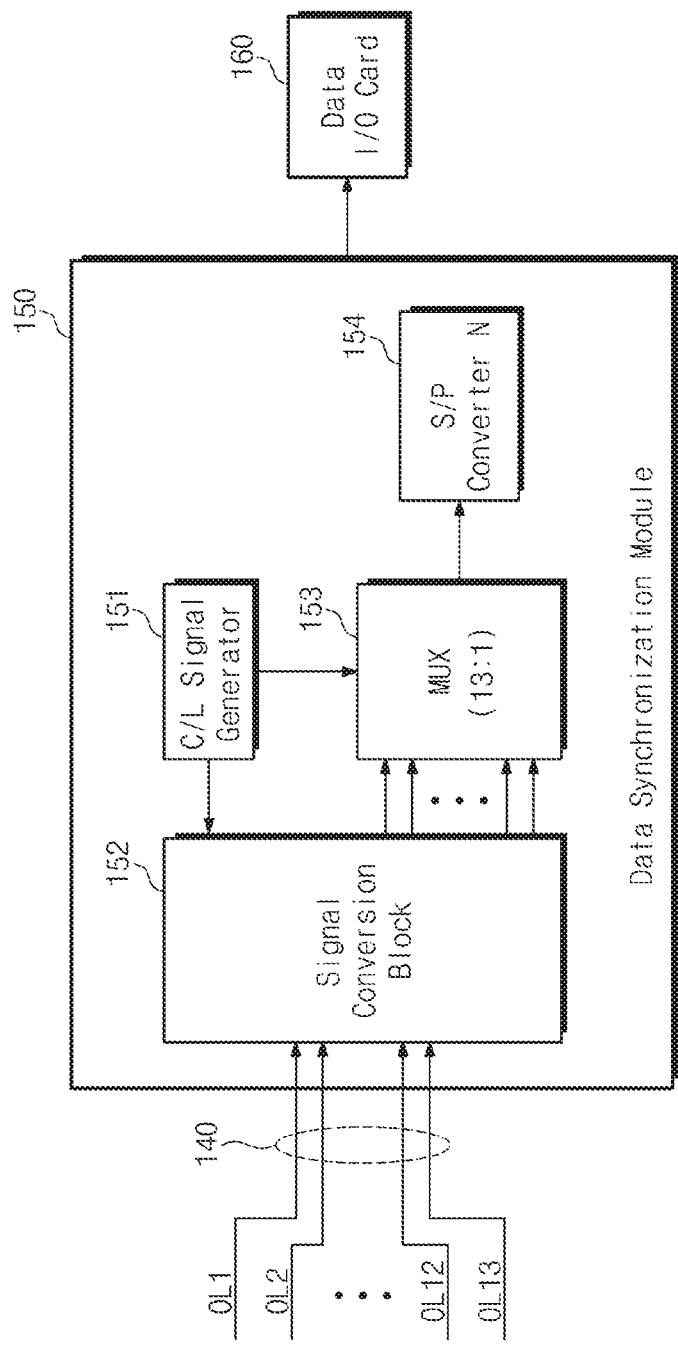
FIG. 3 illustrates a data synchronization module according to the inventive concept.

FIG. 3 illustrates a data synchronization module according to the inventive concept.

Referring to FIG. 3, the data synchronization module 150 includes a clock/load signal generator 151, a signal conversion block 152, a multiplexer 153, and an Nth serial/parallel converter 154.

The signal conversion block 152 receives individual, serial signals corresponding to the signal transmission modules 111 to 123. The signal conversion block 152 converts individual, serial digital signals into parallel digital signals, converts the parallel digital signals into serial digital signals and outputs the serial digital signals. When synchronous, serial digital signals are generated, the signal conversion block 152 generates a synchronous load signal based on a load signal that is generated by the clock/load signal generator 151. The signal conversion unit 152 converts the parallel digital signals into synchronous, serial digital signals based on the generated synchronous load signal. The signal conversion block 152 outputs the synchronous, serial digital signals to the multiplexer 153. To this end, the signal conversion unit 152 may include a number of serial/parallel converters and parallel/serial converters corresponding to the number of the signal transmission modules 111 to 123 (e.g., 13 serial/parallel converters and 13 parallel/serial converters) so that each of the signal transmission modules 111 to 123 corresponds to the serial/parallel converter and parallel/serial converter. The multiplexer 153 multiplexes synchronous, serial digital signals to be a single serial digital signal and outputs the single serial digital signal to the serial/parallel converter 154.

The serial/parallel converter 154 converts the multiplexed serial digital signals into parallel digital signals and outputs the parallel digital signals to the data input/output card 160.

Figure 4A:
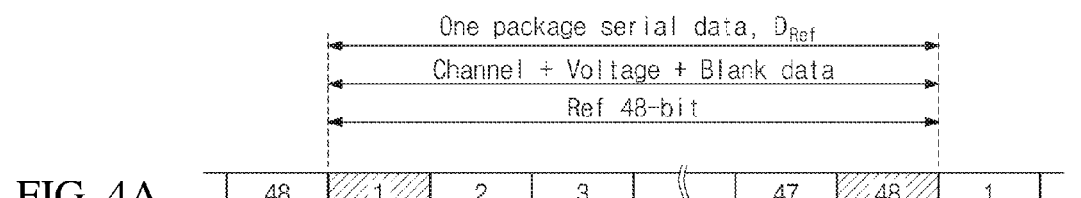
FIGS. 4A to 4C show serial data according to a reference sample rate, a minimum sample rate, and a maximum sample rate according to the inventive concept.
Figure 4B:
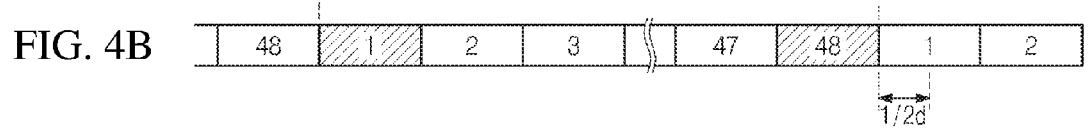
Figure 4C:
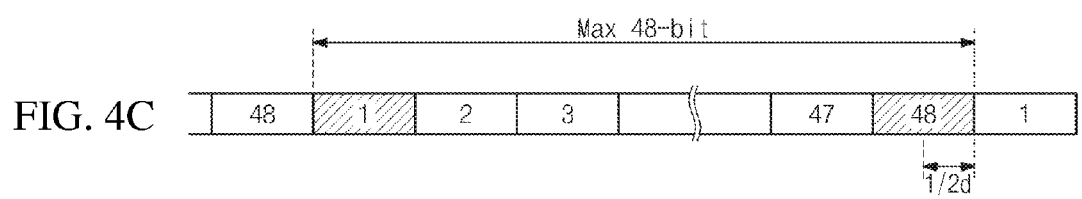

FIGS. 4A to 4C show serial data according to a reference sample rate, a minimum sample rate, and a maximum sample rate according to the inventive concept.

Referring to FIGS. 4A to 4C, the reference clock frequencies of the signal transmission modules 111 to 123 are determined by clock frequencies based on a transmission rate of data output by each of ADCs in the signal transmission modules 111 to 123, i.e., a transfer sample rate of data. The reference clock frequency ($CK_{Ref}$) of the signal transmission module that transmits data of which the transfer sample rate $S_{Ref}$ is 2048 sample/s, information data D is 48 bits, and the number N of channels is 16 may be determined by Equation (1) below:

$$CK_{Ref} = S_{Ref} \times D \times N \times A_{DC} = 2048 \times 48 \times 16 \times 10 = 15.72864 \text{ MHz} \quad (1)$$

where an ADC operation characteristic value $A_{DC}$ is a constant determined according to the characteristic of the ADC and Equation (1) assumes that $A_{DC}$ is 10. 15.72864 MHz determined to be the reference clock frequency $CK_{Ref}$ may be expressed as a reference frequency of 2048 sample/s. In this case, reference transmission data frequency $f_{Ref}$ transmitted through optical lines is 1.572864 MHz. 48-bit reference unit serial data $D_{ref}$ for transferring data having a reference transfer sample rate $S_{Ref}$ of 2048 Sample/s is represented in FIG. 4A.

The reference unit serial data $D_{ref}$ is unit data that includes information bits of 32 bits and non-information data (blank bit) of 16 bits. In this example, the blank bit is a bit that has no information. In this case, the information bits of 32 bits include channel data of 8 bits and voltage data of 24 bits. It is determined as a frequency for the data transmission of a signal transmission module that approaches the reference transmission data frequency $f_{Ref}$.

When the time of the unit serial data D is minimum, a serial data state is shown in FIG. 4B and when the time of the unit serial data D is maximum, the serial data state is shown in FIG. 4C.

The unit serial data D is set to have a length of data corresponding to a value obtained by adding or subtracting a value smaller than a unit bit of predetermined reference unit serial data. The reason why the unit serial data D is set in this way is to ease signal processing and error handling.

The range (+/−0.5 bit) of exemplary unit serial data D is represented by Equation (2) below:

$$D_{Ref} - 0.5d < D < D_{Ref} + 0.5d \quad (2)$$

where $D_{Ref} = 1/f_{Ref}$, and $d = D_{Ref}/48 = 1/(48 f_{Ref})$, so Equation (2) above may be represented by Equation (3) below:

$$(1 - 1/96)/f_{Ref} < f_D < (1 + 1/96)/f_{Ref} \quad (3)$$

When the unit serial data D is changed to unit transmission data frequency $f_D$, it may be represented by Equation (4) below:

$$f_{Ref}/(1 + 1/96) < f_D < f_{Ref}/(1 - 1/96) \quad (4)$$

where $f_{Ref}$ is 1.57286 MHz, so $f_D$ may be represented by Equation (5) below:

$$1.556645 \text{ Mhz} < f_D < 1.589416 \text{ Mhz} \quad (5)$$

Therefore, the range of a reference clock frequency $CK_D$ at which a signal transmission module operates an $A_{DC}$ may be represented by Equation (6) below through multiplication of the unit transmission data frequency $f_D$ of Equation (5) and an ADC operation characteristic value $A_{DC}$:

$$15.56645 \text{ Mhz} < CK_D < 15.89416 \text{ Mhz} \quad (6)$$

The reference clock frequency that an optical transmission module may have may be determined to be the above range and it is possible to determine the reference clock frequency difference $f_D$ between signal transmission modules to be 5 kH. In this case, since a possible clock frequency range is $CK_D = 327.710$ kHz, the maximum number $N_{max}$ of possible signal transmission modules (i.e., $A_{DC}$s) is 65. In this case, the maximum number of possible ADCs is determined to be 65 that is a natural number, 327.710 divided by 5.

Thus, the number of ADCs in the signal processing apparatus 100 is smaller than or equal to 65.

Equation (6) may be represented by Equation (7) with a sample rate $S_D$ based on Equation (1):

$$2026.9 \text{ Sample/s} < S_D < 2069.6 \text{ Sample/s} \quad (7)$$

The sample rate varies in the range in Equation (7) according to the reference clock frequency of a signal transmission module.

Sine a digital data signal received by the signal transmission module is converted in synchronization with the reference sample rate of 2048 sample/s, a sample rate difference $|S_D - S_{Ref}|$ has up to 21.55 sample/s. The data signal of the signal transmission module that has the sample rate difference $\Delta S$ frequently changes by $\Delta S$ in sequence of received data according to a channel number, when compared to a reference data signal.

Thus, the signal transmission module experiences a difference of $\Delta S$ from a synchronous reference signal, and transmits a stable signal as $\Delta S$ decrease. Therefore, the default clock frequency of the signal transmission module is set to be close to the reference clock frequency $CK_{Ref}$.

Figure 5:
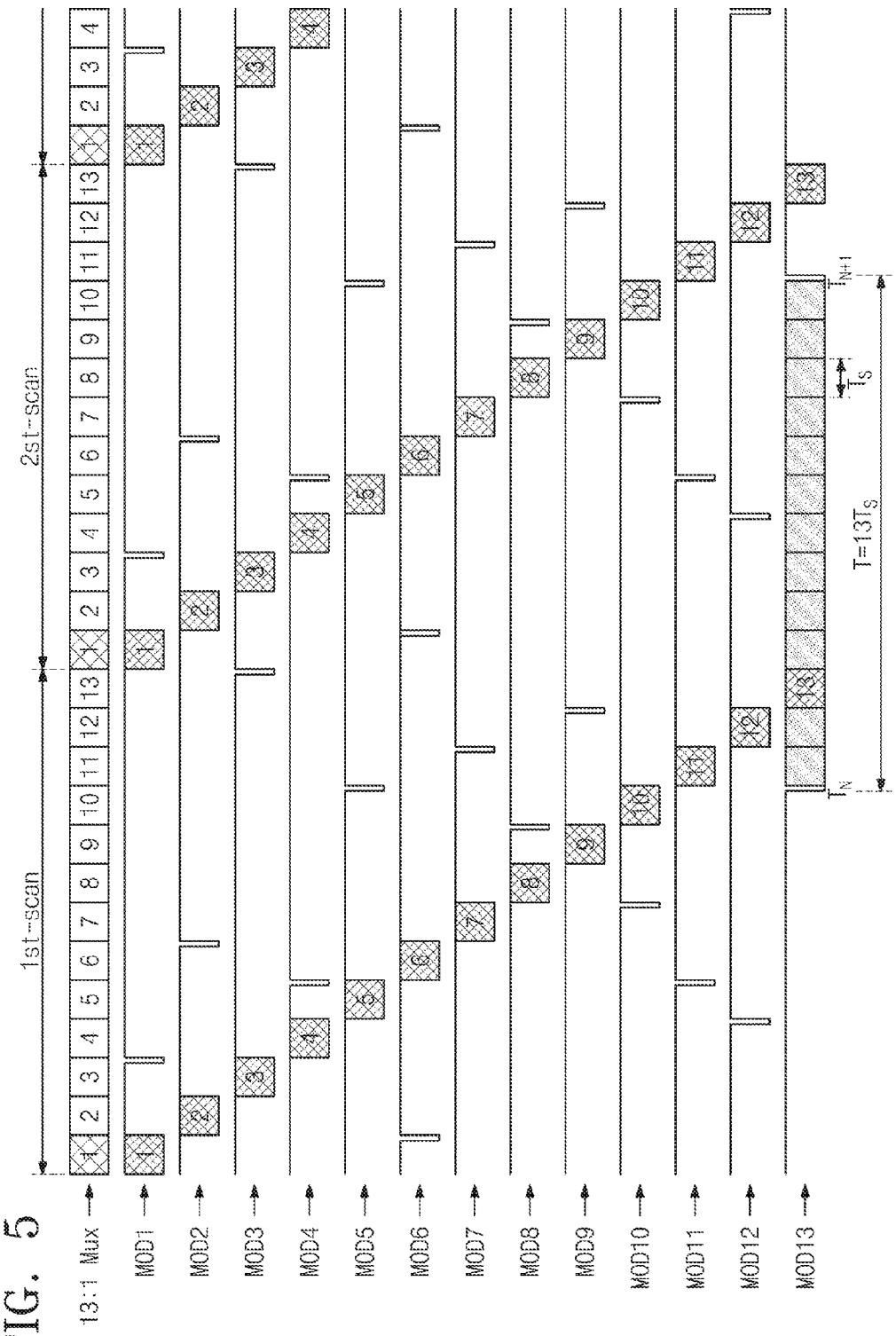
FIG. 5 illustrates a single data package of received data in data arrangement according to the inventive concept.

FIG. 5 illustrates a single data package of received data in data arrangement according to the inventive concept.

Referring to FIG. 5, as shown in FIG. 3, the multiplexer 153 in the signal synchronization module 150 uses a multiplexer that 13:1 multiplexes signals received through 13 optical lines to scan and select data from signal transmission modules and converts parallel data into serial data. FIG. 5 shows SQUID sensor data from each channel that the multiplexer 152 scans and selects for two cycles.

When the signal transmission modules MOD1 to MOD13 111 to 123 repetitively output data from the same channel thirteen times for a single scan, the multiplexer 153 selects one by one among 13 same data.

For example, the operation of scanning data from the thirteenth signal transmission module MOD13 (123) by the multiplexer 153 is discussed. In this case, when the signal transmission module MOD13 123 repetitively transmits data from a $T_N$ channel thirteen times at a $T_s$ interval, the multiplexer 153 may select, at a first scan, third $T_s$ data among thirteen $T_s$s. At a second scan, the signal transmission module MOD13 123 selects one of 13 $T_{N+1}$ channel data. The multiplexer 153 selects the outputs of the signal transmission modules in the same manner one by one each time a scan is performed once and the output is transmitted to the computer 170 through an output to the data input/output card 160.

The data input/output card 160 removes 16 bits (blank data) having no information among 48-bit data that is transmitted according to a reference synchronization signal having a sample rate of 2048 sample/s, and transmits only 32-bit (channel data and voltage data) to the computer 170 through a 32-port data input/output board.

FIG. 6 illustrates a data package of received data according to the inventive concept.

Referring to FIG. 6, in the case that there are 13 signal transmission modules, each of the signal transmission modules receives signals for 16 channels and thus 208 data is set as a single package. Data on channels 1 to 208 is collected in a single package. For 208 channels, 32-bit data excluding 16 bits that have no information among 48-bit data is stored as a single package.

Package indexes are sequentially shown from P-001 to P-208. For example, in the case of the package index P-001, the M01 in the left column "M01-01" is a module (e.g., signal transmission module) number and represents a first signal transmission module, and the "01" is a channel number and represents a first channel in the first signal transmission module. The number "001" in the right column is a sensor number (or whole channel number) and represents a first sensor. For example, in the case that the SQUID sensor is an EEG sensor, the sensor number (e.g., "001") may represent the pad number of the EEG sensor.

Figure 7:
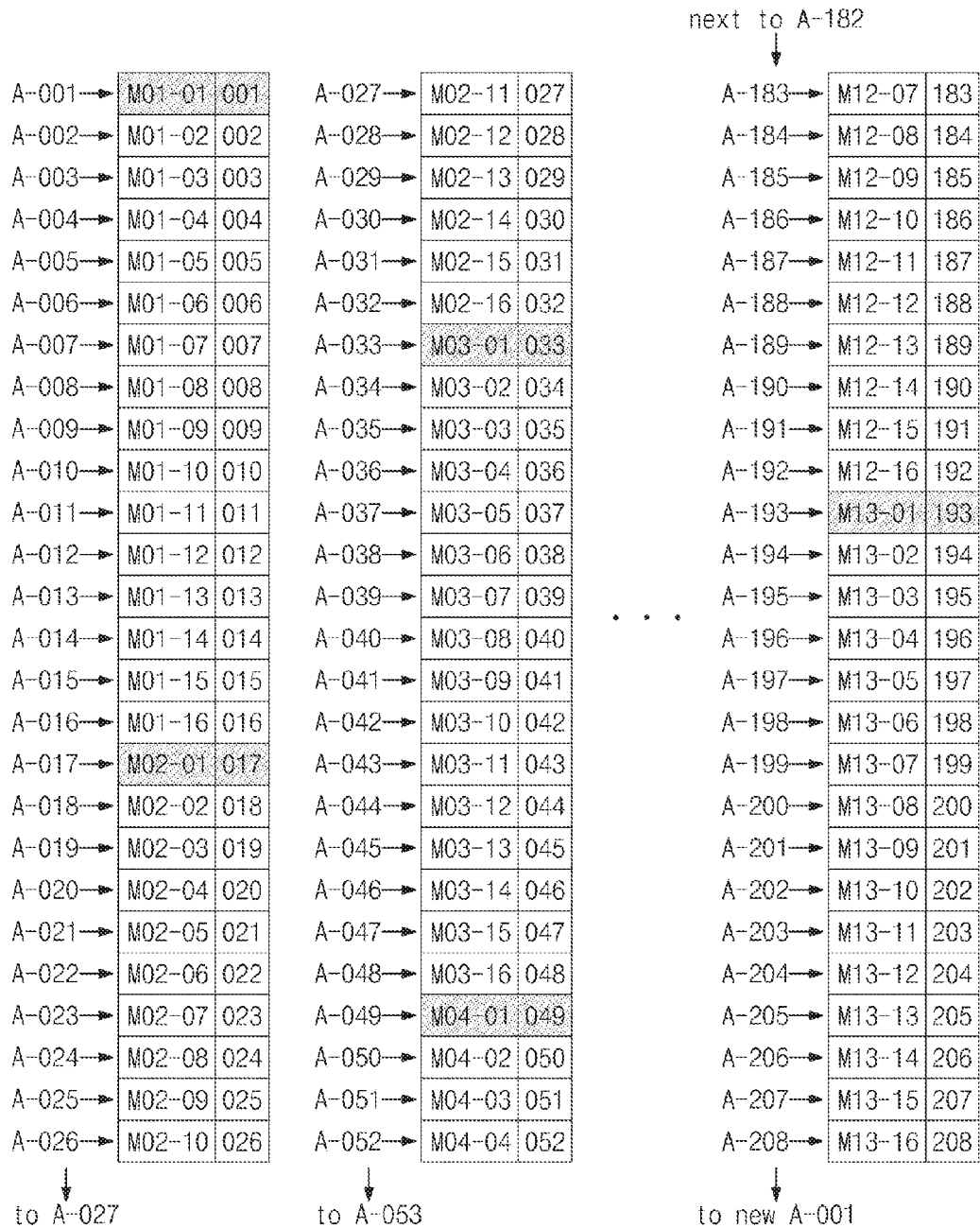
FIG. 7 illustrates a data package arranging the data package of FIG. 6.

FIG. 7 illustrates a data package arranging the data package of FIG. 6.

FIG. 7 shows how to classify 208 packaged 32-bit data, in sequence of the whole channel number by using channel information. As an example, the computer 170 may store the 208 packaged 32-bit data in a memory and classify channel numbers in sequence by using channel information. Accordingly, arrangement is performed based on a signal transmission module number and a channel number.

Arranged package indexes are sequentially shown from A-001 to A-208. A module number, a channel number and a sensor number are all sequentially arranged.

Figure 8:
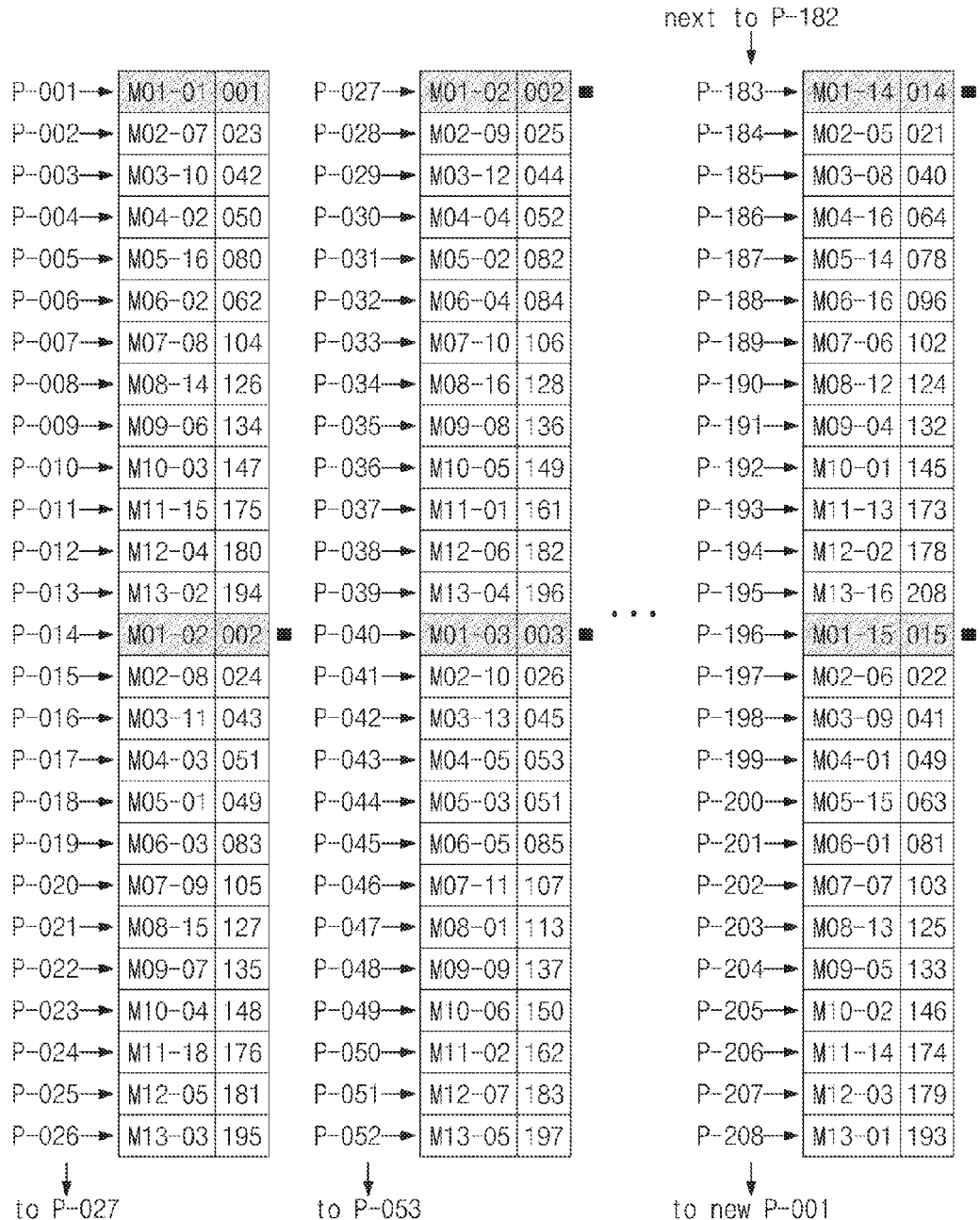
FIG. 8 illustrates when lost channel data received from signal transmission modules having no reference sample rate is included.

FIG. 8 illustrates when lost channel data received from signal transmission modules having no reference sample rate is included.

Referring to FIG. 8, data from signal transmission modules having no reference sample rate (e.g., 2048 sample/s) is represented in such a manner that a specific channel is overlapped or lost at the ratio of a sample rate difference ΔS. When the sample rate $S_D$ of the signal transmission module is lower than the reference sample rate of 2048 sample/s ($S_D$<2048 sample/s), data from a single channel may be lost.

In this case, determination may be performed based on a channel number, second channel data "M01-02:002" is repeated two times (as in P-014 and P-027) and thus overlapped but "M01-16:016" is not received. When the computer 170 finds overlapped data, data from another channel disappears. When a data package is arranged in sequence of whole channel number, one of overlapped channel data is deleted. In this case, the computer 170 corrects data from a missing channel data not detected by using channel data from the same channel number in the previous data package.

As such, the received that receives the data package including the lost channel data corrects the missing channel data, e.g., "M10-16:016" by using channel data in the previous data package and arranges data in sequence of whole channel number to perform signal processing as in FIG. 7.

Figure 9:
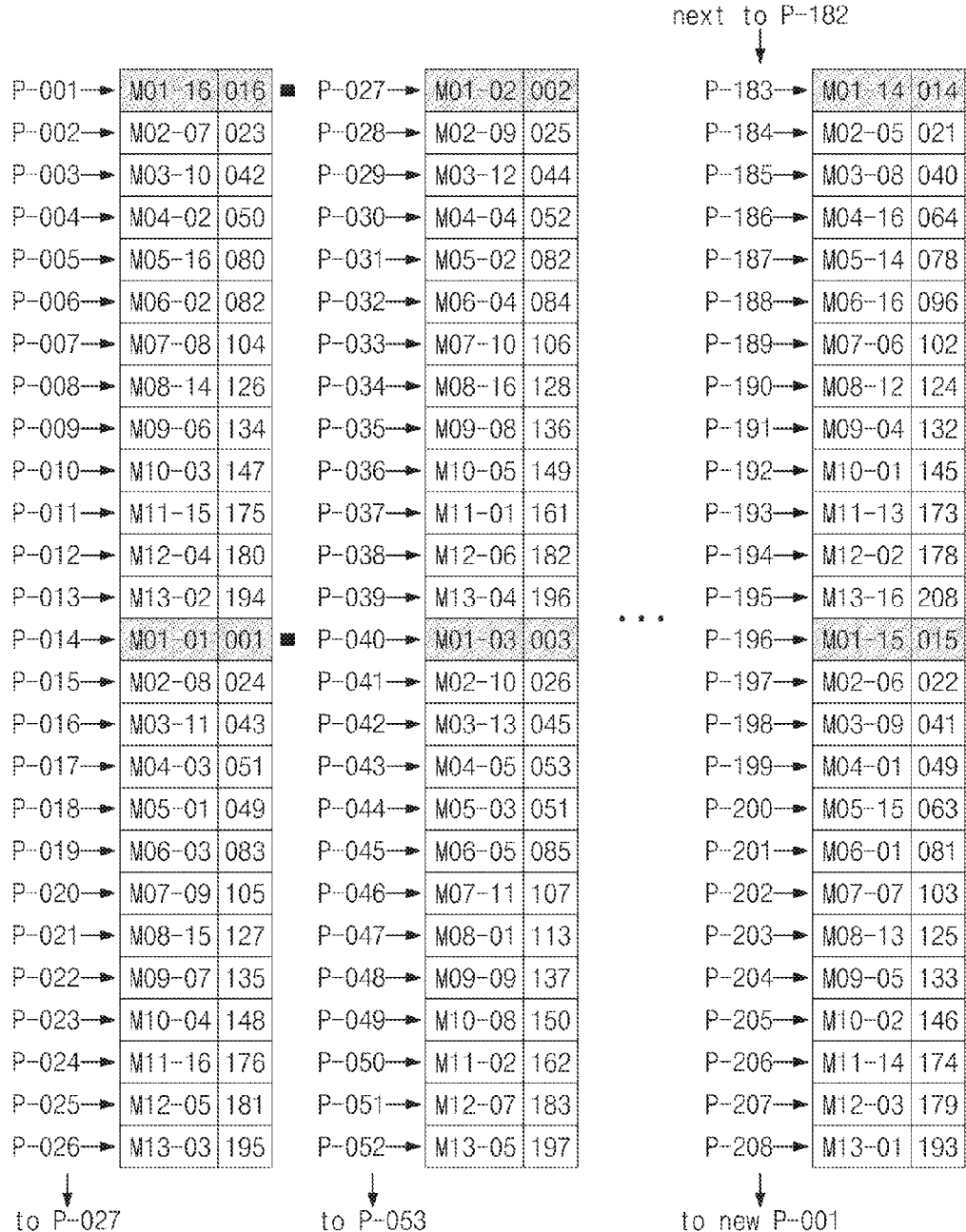
FIG. 9 illustrates a data package received after the data package of FIG. 8.

FIG. 9 illustrates a data package received after the data package of FIG. 8.

Referring to FIG. 9, the channel data "M10-16:016" is first collected and it is possible to generate a data package without an overlapped or omitted channel. However, a previously received data package and collection sequence are changed.

Figure 10:
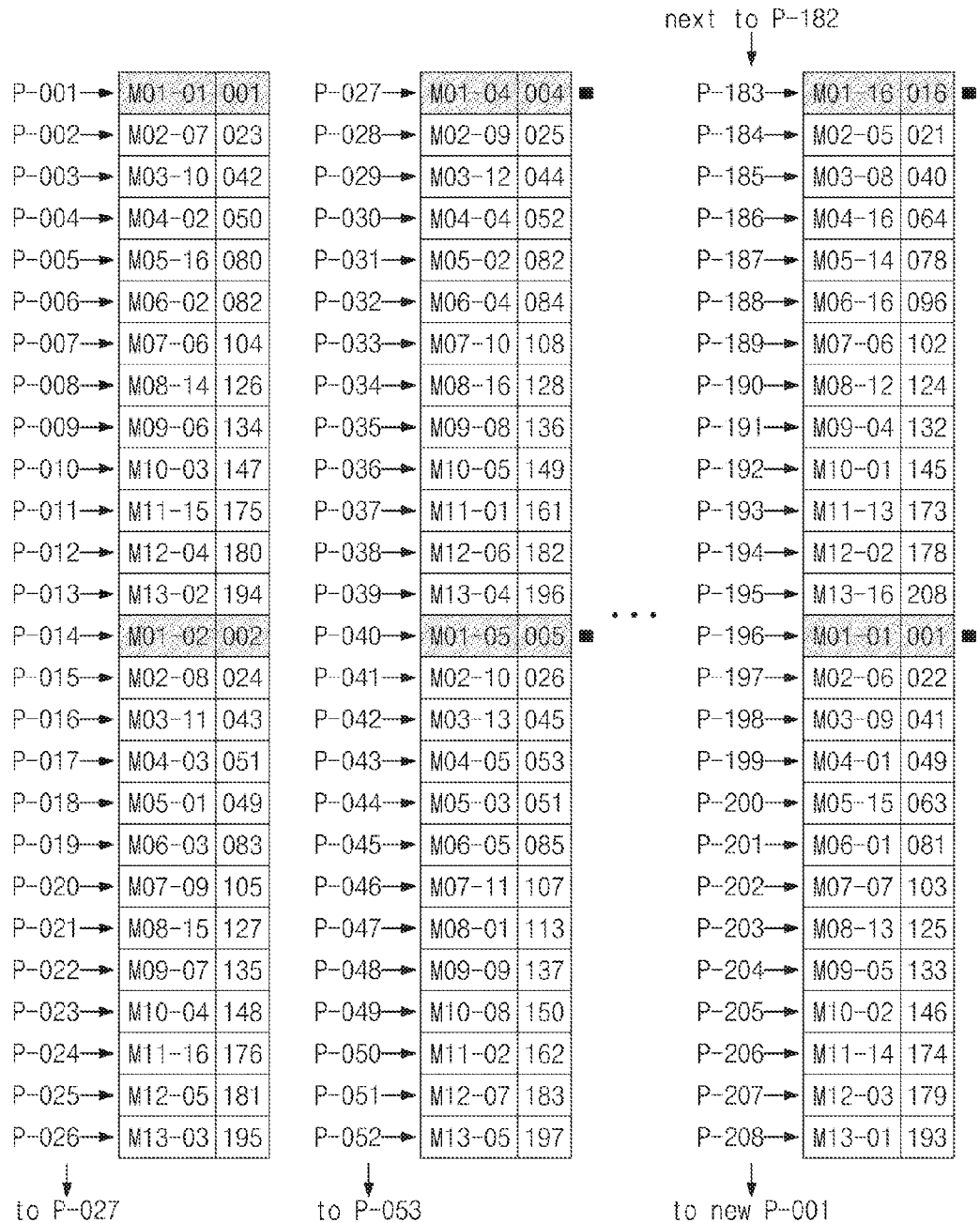
FIG. 10 illustrates a data package from which channel data is omitted according to the sample rate of a signal transmission module.

FIG. 10 illustrates a data package from which channel data is omitted according to the sample rate of a signal transmission module.

Referring to FIG. 10, the channel data "M01-03:003" is omitted (absent) and due to the omitted channel data, "M01-01:001" is overlapped two times (P-001 and P-196). When data disappears from the data package, another channel is overlapped. When package data is arranged in sequence of whole channel number, one of overlapped channel data is deleted, and omitted channel data is corrected to channel data from the same channel number in the previous data package.

Figure 11:
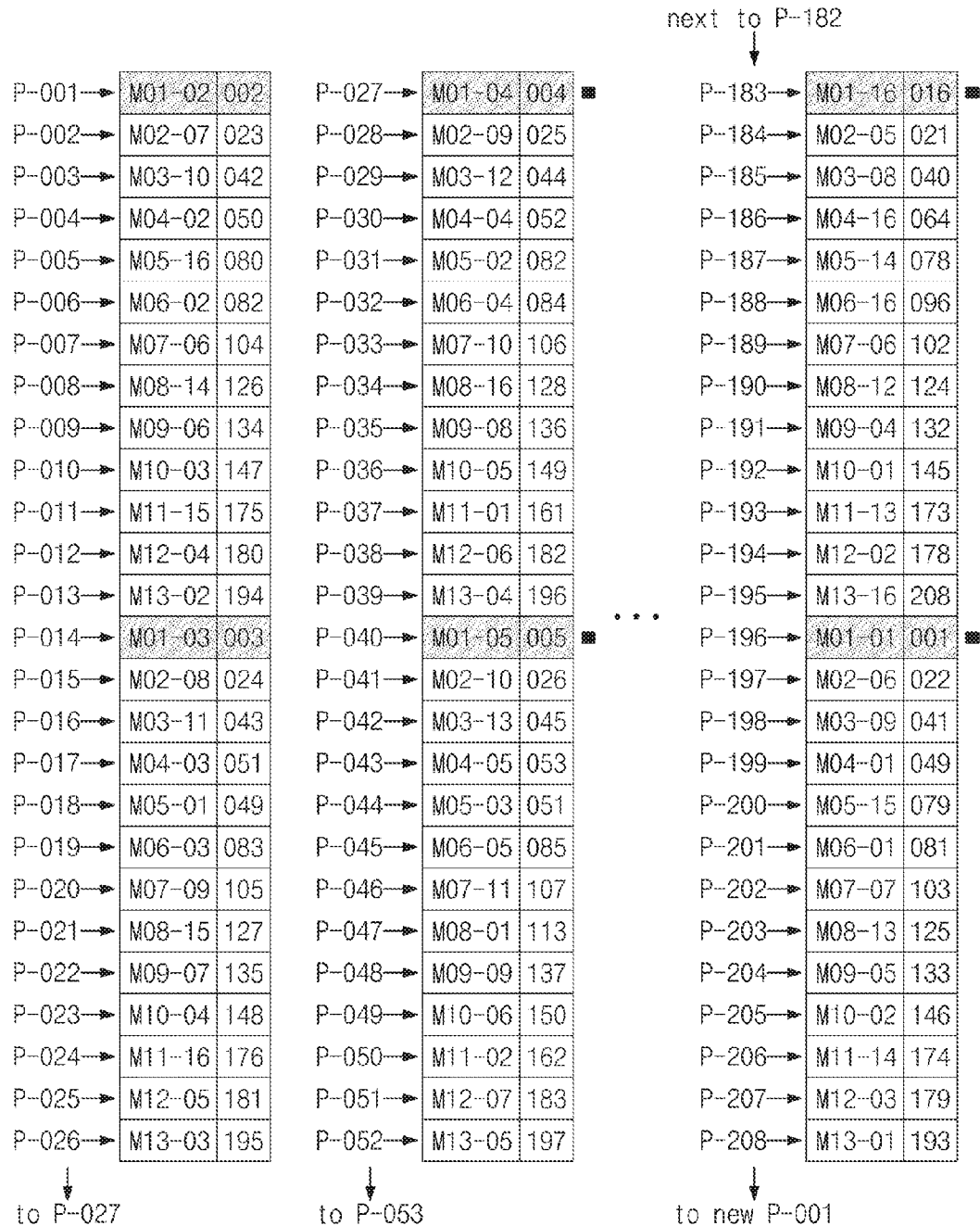
FIG. 11 illustrates a data package received after the data package of FIG. 10.

FIG. 11 illustrates a data package received after the data package of FIG. 10.

Referring to FIG. 11, "M01-02:002" is first collected, and data is packaged and stored without overlapped or lost channel data.

Figure 12A:
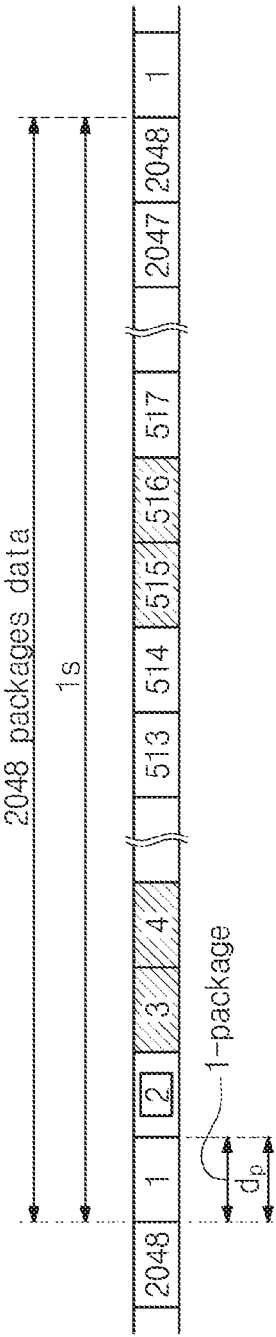
FIGS. 12A to 12C illustrate a time difference and data package state when changing a data package sample rate.
Figure 12B:
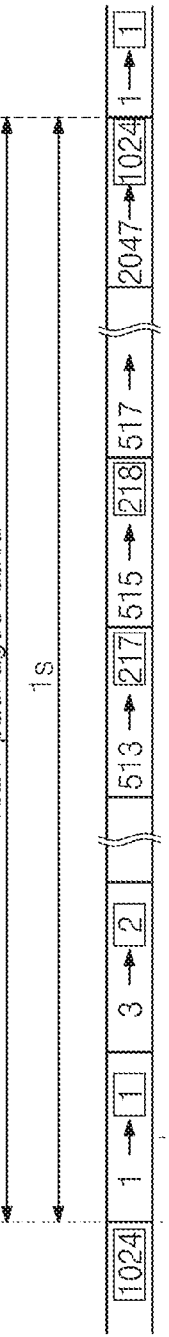
Figure 12C:
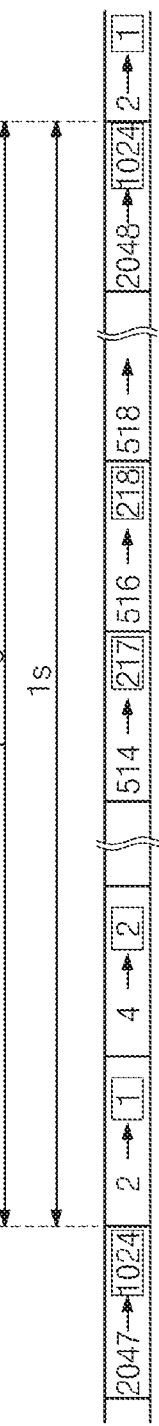

FIGS. 12A to 12C illustrate a time difference and data package state when changing a data package sample rate.

Referring to FIGS. 12A to 12C, when there is no channel data in a data package, there is a slight time difference in transmission time from overlapped data because data is loaded from the previous data package. In order to decrease such a time difference from the overlapped data, the collection of the data package may be performed at a reference sample rate, a collected data package be arranged and temporarily stored, and it is possible to finally store the stored data package alternately, such as every even sequence or every odd sequence.

As shown in FIG. 12A, a time difference and data package state when changing the sample rate of a data package having a sample rate of 2048 sample/s to 1024 sample/s as shown in FIG. 12A are shown in FIGS. 12B and 12C.

FIG. 12A shows package data when data having a transfer sample rate of 2052 sample/s output from signal transmission modules is packaged by a computer at 2048 sample/s through the data input/output card 160.

In this case, a data package is corrected by the loading of data from a lost channel from the previous data package about four times for one second due to the difference of the transfer sample rate.

The corrected data package is generated every about 512 data packages, and for example, 4th, 516th, 1028th, and 1540th data packages are corrected by the loading of lost channel data from the previous data packages, 3rd, 515th, 1027th and 1539th data packages, respectively. In addition, specific channel data is overlapped in 4th, 516th, 1028th, and 1540th data packages.

The computer 170 may select an odd-sequence data package or even-sequence data package in order to prevent the overlapping of some channel data in a data package.

FIG. 12B represents the data collection of 1024 sample/s that selects an odd-sequence data package in order to prevent the overlapping of channel data. When the odd-sequence data package is selected, supplemented data packages are not selected and there is no time change.

FIG. 12C represents the data collection of 1024 sample/s that selects an even-sequence data package in order to prevent the overlapping of channel data. When the even-sequence data package is selected, supplemented data packages are selected and the whole data is delayed by a time difference $d_p$ corresponding to a single data package and thus a time difference decreases.

As such, the computer 170 collects sensor data from alternately positioned data packages, such as odd-sequence data packages or even-sequence data packages and thus a reference reception sample rate decreases from 2048 sample/s to 1024 sample/s, but overlapped data may be removed and a data reception time difference may be solved in the measurement range of 1024 sample/s.

As in the inventive concept, when a sensor system receiving the effect of slight digital noise, such as a SQUID sensor converts an output signal into a digital signal to transmit the digital signal to the computer, it is possible to decrease the number of ADCs. Also, data is transmitted at difference reference clock frequencies of the ADCs, and a sensitive sensor does not receive the effect of digital noise.

Data that is transmitted at different transfer sample rate by using different reference clock frequencies by ADCs, respectively is collected and arranged by a computer in the form of a data package, and alternately stored, such as every odd-sequence data package or every even-sequence data package to be capable of collecting a stable signal.

The signal processing apparatus proposed by the inventive concept digital-transmits the output voltages of 160 SQUID sensors operating in a magneticallay shielded room, in units of 10 modules through optical cables and simultaneously digital-transmits EEG data from 32 channels and the additional voltage outputs of additional 16 channels outside the magneticallay shielded room through optical cables. Accordingly, the signal processing apparatus converts serial digital data into synchronous, serial digital data through optical cables including 13 optical lines to transmit the synchronous, serial digital data to the computer through the data input/output card.

Accordingly, the signal processing apparatus proposed in the inventive concept may utilize the outputs of 160 SQUID sensors and the outputs of 32 EEG sensors to form a magneto-electro encephalography (MEEG) system for brain's functions and medical diagnosis. However, the above-described implementation of the signal processing apparatus is an example and it is also possible to apply the signal processing apparatus proposed in the inventive concept to other systems that may minimize the effect of noise due to a clock signal according to analog to digital conversion on a sensor signal including a plurality of channels.

The signal processing apparatus of the inventive concept may set a reference clock frequency used for analog to digital conversion of a signal received from a plurality of sensors to leave a frequency region available to a sensor to be capable of decreasing the effect of noise generated in the sensor. Also, the signal processing apparatus may prevent an error in magnetic field measurement due to beating that occurs according to the operations of a plurality of sensors.

While particular embodiments have been described in the detailed description of the present invention, many variations may be made without departing from the scope of the present invention. Therefore, the scope of the present invention should not be limited to the above-described embodiments and should be defined by the following claims and equivalents thereof.

What is claimed is:

1. A signal processing apparatus comprising:
   superconducting quantum interference device (SQUID) sensors configured to sense a signal for each of a plurality of channels;
   analog to digital converters (ADC) configured to convert analog signals input to a predetermined number of channels from the SQUID sensors into digital signals by using a clock signal;
   local oscillators corresponding to the ADCs, respectively and configured to generate the clock signal having a reference clock frequency for an operation of a corresponding ADC; and
   a controller configured to the local oscillators to enable the reference clock frequency to have a frequency beyond a frequency range available to the SQUID sensor.

2. The signal processing apparatus of claim 1, wherein the controller is configured to set the reference clock frequency to enable a minimum beating frequency to have a frequency beyond the frequency range available to the SQUID sensor based on a preset reference clock frequency.

3. The signal processing apparatus of claim 2, wherein the frequency range available to the SQUID sensor has a frequency range of about 0 to about 200 Hz.

4. The signal processing apparatus of claim 2, wherein the controller is configured to set the reference clock frequency of a clock signal input to each of the ADCs at a preset frequency interval based on the reference clock frequency.

5. The signal processing apparatus of claim 4, wherein the controller is configured to select the reference clock frequency to have a length of data corresponding to a value that is obtained by adding or subtracting a value smaller than a unit bit of predetermined reference unit serial data.

6. The signal processing apparatus of claim 4, wherein a number of the ADCs is determined to be smaller than or equal to a natural number that is obtained by dividing a reference clock frequency range operating the ADC by the frequency interval.

7. The signal processing apparatus of claim 1, further comprising:
   a data synchronization module configured to receive, through an optical line, data obtained through digital conversion from each of the ADCs, and synchronize the received data based on a reference synchronization signal;
   a signal transmission module configured to signal-process the synchronized data; and
   a data input/output card connected to between the data synchronization module and the signal transmission module and configured to transmit the data synchronization through the data synchronization module to a computer.

8. The signal processing apparatus of claim 7, wherein the data input/output card is configured to extract data on a channel and a voltage, remove data having no information, and output data obtained through removal to the computer.

9. The signal processing apparatus of claim 8, wherein the signal transmission module is configured to generate temporary data package based on data on the channel and the voltage, and re-arrange data in sequence of the channel number by using channel information in the temporary data package to generate a data package.

10. The signal processing apparatus of claim 9, wherein the signal transmission module is configured to delete one of overlapped channel data and generate the data package through loading lost channel data from a previous package data, when there is overlapped channel data in the temporary data package.

11. The signal processing apparatus of claim 10, wherein the signal transmission module is configured to alternately select the data packages generated to have a reference sample rate and generate data package having a sample rate that is obtained by reducing a data package sample rate to ½ of the reference sample rate.

* * * * *